United States Patent [19]

Scheps

[11] Patent Number: 5,530,711
[45] Date of Patent: Jun. 25, 1996

[54] LOW THRESHOLD DIODE-PUMPED TUNABLE DYE LASER

[75] Inventor: Richard Scheps, Del Mar, Calif.

[73] Assignee: The United States of America as represented by the Secretary of the Navy, Washington, D.C.

[21] Appl. No.: 299,865

[22] Filed: Sep. 1, 1994

[51] Int. Cl.⁶ .................................................. H01S 3/10
[52] U.S. Cl. .............................. 372/20; 372/54; 372/92; 372/98; 372/99
[58] Field of Search .................................. 372/20, 54, 92, 372/98, 99

[56] References Cited

U.S. PATENT DOCUMENTS

| | | | |
|---|---|---|---|
| 3,735,280 | 5/1973 | Johnston, Jr. . | |
| 3,890,578 | 6/1975 | Wang . | |
| 3,913,033 | 10/1975 | Tuccio et al. . | |
| 4,227,159 | 10/1980 | Barrett et al. . | |
| 4,627,068 | 12/1986 | Johnson et al. | 372/54 |
| 4,932,031 | 6/1990 | Alfano et al. . | |
| 5,090,019 | 2/1992 | Scheps | 372/27 |
| 5,097,477 | 3/1992 | Scheps . | |
| 5,119,394 | 6/1992 | Scheps . | |
| 5,121,402 | 6/1992 | Scheps . | |
| 5,182,759 | 1/1993 | Anthon et al. | 372/72 |
| 5,200,972 | 4/1993 | Scheps . | |
| 5,218,610 | 6/1993 | Dixon . | |
| 5,249,189 | 9/1996 | Schaps | 372/20 |
| 5,285,467 | 2/1994 | Scheps . | |
| 5,307,358 | 4/1994 | Scheps . | |

OTHER PUBLICATIONS

Text, Cover page for "Dye Laser Principles" with Applications, F. J. Duarte (No Date Available).
"The Measurement Of Internal Losses In 4–Level Lasers", Physics Letters, vol. 20, No. 3, 15 Feb. 1966.
"Low–Threshold Dye Laser Pumped by Visible Laser Diodes", Richard Scheps, IEEE Photonic Technology Letters, vol. 5, No. 10, Oct. 1993.
"Continuous Wave Visible Diode–Pumped Dye Laser", D. P. Benfey et al., Laser Technology Associates, Inc., 204/SPIE vol. 2115, Visible and UV Lasers (No Date Available).
"Dye Lasers Pumped by Radiation From High–Power Semiconductor Lasers", O. V. Bogdankevich, 1987 American Institute of Physics (No Date Available).
"Operation of An Organic Dye Solution Laser", Applied Physics Letters, vol. 17, No. 5, 15 Sep. 1970.
"Stimulated Emission Observed from an Organic Dye, Chloro–aluminum Phthalocyanine", IBM Journal, Mar. 1966.

Primary Examiner—Leon Scott, Jr.
Attorney, Agent, or Firm—Harvey Fendelman; Thomas Glenn Keough; Eric James Whitesell

[57] ABSTRACT

A method and apparatus for producing stimulated emission from a laser gain element containing an organic dye are described in which optical pumping is produced by visible laser diodes. Low threshold pump power and high optical conversion efficiency are achieved by producing a laser resonator mode waist at or near the laser gain element and spatially superimposing a pump mode waist at or near the laser resonator mode waist. Using low power visible AlGaInP laser diodes and the dyes rhodamine 700, oxazine 750, DOTCI or oxazine 1 in the laser gain element, incident pump threshold powers as low as 5.4 mW, optical conversion efficiencies of 49% and tunable emission between 700 nm and 800 nm were achieved. This laser was scaled to higher cw output power by using a DCM-based pump dye laser. In a preferred embodiment the laser resonator has two reflective elements in a nearly hemispherical configuration. Angular multiplexing of laser diodes to scale to higher laser diode pump power is described. Short pulse, cw or long pulse dye laser operation is possible for the dye laser apparatus described. In addition, high modulation rate dye laser operation pumped by high modulation rate laser diodes is described.

63 Claims, 8 Drawing Sheets

4,530,711

LOW THRESHOLD DIODE-PUMPED TUNABLE DYE LASER

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The present invention relates to lasers and optical pumping of lasers and, particularly, to a technique for diode pumping a dye laser.

Dye lasers, and particularly organic dye lasers, have certain unique features. Depending on the specific dye in the laser, the output wavelength is tunable over a bandwidth of approximately 100 nanometers. Dye lasers can operate from the ultraviolet to the infrared, and a single laser resonator cavity can be used to cover this entire wavelength range simply by changing dyes and coatings on the intracavity optical components as appropriate.

The first dye laser was invented in 1966. See, for example, P. P. Sorokin and J. R. Lankard, *IBM Journal*, Vol. 10, p. 162, 1966. This dye laser, as all lasers, consists of three main parts: the pump source (generally an optical source such as a laser or flashlamp); the gain element, also called the laser medium, the dye-containing gain element or the laser gain element; and an optical resonator, composed of end reflective elements such as mirrors that are optically aligned to resonate the intracavity optical flux. Other components can be introduced in the resonator, such as wavelength tuning components or lenses.

In a dye laser the pump energy originates with an optical source, either from flashlamps or another laser. The laser medium or dye-containing gain element may be an organic dye dissolved in a liquid solvent such as ethylene glycol, although the "solvent" can be a solid state host for the dye such as a plastic, glass, thin film or gel. The dye concentration is relatively low, ranging from approximately $10^{-3}$ to $10^{-5}$ molar. The optimum concentration depends on many factors, including the pump wavelength, absorption length of the gain medium for the pump flux, the desired output wavelength, the gain and loss of the dye at the laser wavelength, the dye flow rate and the resonator configuration. Interactions between the dye and solvent can affect the efficiency and gain at a specific laser wavelength.

The dye molecules are excited by absorbing pump light. Part of this energy is released in the form of radiation. Spontaneous emission, or fluorescence, is one form in which radiation may be released. However, under appropriate conditions, the radiation loss occurs through stimulated emission. In this case, the emitted light is coherent. Stimulated emission occurs when the laser medium is contained in a suitably designed resonator. The feed-back of the emitted radiation stimulates even more radiation, and with each pass optical amplification occurs. In such a case the resonator is said to produce laser emission.

A suitable pump source for exciting a given dye laser must be one that emits radiation that can be absorbed by the dye in the gain element. The absorption wavelengths are determined by the specific nature of the dye. Most laser dyes absorb at wavelengths slightly shorter than the emission wavelengths. The shift between the wavelength corresponding to the absorption maximum and that corresponding to the emission maximum is sometimes referred to as the "Stokes shift". For dyes that emit between 700 nm to 800 nm, the absorption bands are typically between 600 nm and 700 nm. These dyes are generally pumped at 647 nm by a krypton ion laser. Dye absorption bands are structure-less and broad, spanning a region of approximately 100 nm. In addition to the Stokes shifted absorption band, many dyes also absorb in the UV. UV pump lasers include nitrogen and excimer lasers such as KrF or XeCl lasers. Excimer pumped dye lasers are capable of high operating efficiency and high repetition rate.

Several years after the first demonstration of a pulsed dye laser, the first continuous wave (cw) dye laser was demonstrated. See, for example, O. G. Peterson, S. A. Tuccio and B. B. Snavely, *Applied Physics Lett.*, vol. 17, p. 245, 1970. This laser was pumped by an argon ion laser.

There is an enormous versatility to the operating modes that a dye laser is capable of. This versatility has allowed the dye laser to continue to be a vital optical tool for research, medical, commercial and military applications over the decades since it was first developed. These modes of operation are too numerous to list here completely, but a concise listing are: tunable cw output from 400 nm to 1 μm, stable single-mode operation with linewidths less than 1 kHz; tunable pulsed operation from 320 nm to 1.2 μm, conversion efficiencies (pump power in to tunable dye laser power out) exceeding 50%, extremely high pulse energies including an output of over 100 Joules in a single pulse; ultra-short pulses as short as 27 femtoseconds (fs); high average power exceeding 1 kW and broad bandwidth.

When first introduced, dye laser operation could not be duplicated by other sources. No other class of lasers could produce tunable cw or pulsed radiation at comparable power levels. However, in recent years developments in the generation of tunable solid state lasers and nonlinear optical conversion techniques have greatly reduced the operating regime for which dye lasers are the most appropriate source. In particular, the introduction of the Ti:sapphire laser in 1985 has virtually eliminated the use of dye lasers at wavelengths greater than approximately 725 nm. The Ti:sapphire laser operates both cw and pulsed. As a cw laser, Ti:sapphire is often pumped with an argon ion laser while as a pulsed laser it is typically pumped by the second harmonic of a Nd:YAG laser. Organic dyes do not operate efficiently above 800 nm, and for this wavelength region Ti:sapphire is an ideal replacement for the dye laser. In addition, the convenience of a solid state laser is a compelling advantage compared to a dye laser. Dye lasers typically contain dyes dissolved in an organic solvent. Many solvents are typically used and include ethylene glycol, propylene carbonate, dimethly sulfoxide (DMSO), methanol, ethanol, water, and numerous others. Dye solutions must be mixed and the dye solution must flow through the excitation beam to prevent heating and mitigate losses induced by photochemically degradation of the dye.

Another area where dye lasers have been challenged is in the production of pulsed radiation throughout the visible spectrum. The recent introduction of optical parametric oscillators (OPO) pumped by the third harmonic of a Nd:YAG laser at 355 nm produces tunable, efficient operation from approximately 450 nm out to 4 μm. The OPO material is solid state, providing the user with the convenience of a solid state material. This is in contrast to the required dye flow plumbing and dye mixing inherent in most dye lasers. However, the OPO is limited to several hundred mJ per pulse and average powers of only several Watts. For higher average power or for higher energy per pulse the dye laser is a more suitable approach. Also, OPOs produce short (approximately 10 ns) pulses, which may be unsuitable for certain applications. For example, transmission of the pulse through an optical fiber might produce optical damage to the fiber due to the high peak power. In this case a longer pulse is desirable.

For tunable long pulse or cw emission from the near UV up to approximately 750 nm the dye laser is still the optimum choice. Dyes are inexpensive, especially compared to the cost of manufacturing a solid state laser gain element. For high repetition rate, tunable dye lasers demonstrate high efficiency and are among the most convenient to use.

The recent trend in dye lasers in the commercial environment is one that emphasizes dye laser convenience while complying with governmental regulations controlling the use, exposure and disposal of dyes and their organic solvents. To this end, two notable developments have recently been introduced. The first, used in several medical laser applications, is the dye cartridge. The cartridge contains a highly concentrated premixed dye solution. The dye flow system typically contains filtration units that remove depleted dye from the solution. The operation of this type of laser allows much greater operating lifetime. Part of the dye solution (about 10%) is continuously circulated through the filtration unit to remove depleted, or in some cases all, of the dye. Simultaneously, fresh, highly concentrated dye solution is injected back into the flow system. In this manner a small volume of dye solution can last for many hours of uninterrupted use. Once the dye cartridge is depleted, it is replaced with a new one, and the filter is replaced as well. The operator does not have to touch or mix the dye.

A more interesting development has been the introduction of dye-impregnated plastics. The plastic host, typically polymethyl methacrylate (PMMA), replaces the solution in a dye laser and allows the convenience of a solid state gain element at only a fraction of the cost. In addition, the advantages of the dye laser, including the high tunability, the wide wavelength range, the ability to operate in a number of different modes (cw, high repetition rate, long pulse, etc.) and the low cost of the gain element, are maintained when using a plastic impregnated with a dye as the laser gain element. Other types of solid state dye laser gain elements have been developed including dyes in glasses, dyes in gels and thin films of dyes.

Overall electrical efficiency is an important consideration for lasers operating in an environment where primary power is limited. For laser pumped lasers, the overall electrical efficiency ($\eta_e$) is determined by the product of the electrical-to-optical conversion efficiency of the pump laser ($\eta_p$), the efficiency of the relay optics used to transport the optical pump flux to the laser gain element ($\eta_t$) and the optical conversion efficiency ($\eta_o$). The optical conversion efficiency is the ratio of laser output power to pump power incident on the gain element. For cw dye lasers, $\eta_o$ can exceed 50%, but the electrical efficiency of the pump laser is generally quite low. For ion lasers, $\eta_p$ is typically 0.05%, exclusive of cooling. Cooling is required to remove heat from the ion laser and generally consumes a great deal of power and/or tap water. One method of producing higher $\eta_p$ is to pump with a cw, laser diode-pumped, doubled Nd:YAG laser. However, the cost per Watt of a diode-pumped, doubled Nd:YAG laser is substantially higher than that of an ion laser. In addition, 532 nm is an ineffective wavelength for pumping near-IR emitting dyes.

Another method of increasing $\eta_p$ is based upon using laser diodes directly to pump the dye. A patent by G. Wang, U.S. Pat. No. 3,890,578, describes a waveguide laser in a cell pumped by pulsed AlGaAs laser diodes emitting at 820 nm. The dye in the waveguide laser cell is IR 140. The diodes were pulsed at 50 μs. However, the concept demonstrated by Wang cannot easily be scaled to higher pump power or to other types of dye cells. In addition, it is not clear that this type of configuration would work for a cw laser. A report of direct diode pumped dye lasers appeared in 1987; see, for example, O. V. Bogdankevich, M. M. Zverev, E. M. Krasavina, I. V. Kryukova and V. F. Pevtsov, *Soviet Journal of Quantum Electronics*, vol. 17, p. 133, 1987. In this work, an e-beam excited visible semiconductor laser was used to excite rhodamine 6G and coumarin 47 dyes. While this work is of interest scientifically, there is little possibility that these blue-green semiconductor lasers will be available at practical power levels when pumped by more conventional sources. E-beams are generally large, high-voltage sources and are inconvenient for most purposes. In addition, these semiconductor lasers are also pulsed, and it is not clear that this technique would work cw.

A cw diode-pumped dye laser was described that is based on a commercial ion laser-pumped dye laser; see D. P. Benfey, R. E. Boyd, D.C. Brown, J. C. Watkins, W. J. Kessler, S. J. Davis, C. Otis and L. Pedulla, *Proceedings of the SPIE*, vol. 2115, p. 204, 1994. Because these authors did not design the laser resonator, but instead used a commercial laser that was designed to be pumped with an ion laser, they were unable to take advantage of the unique properties of laser diodes. The efficiency produced using the commercial laser resonator was quite low. With 405 mW from the diodes, the maximum output obtained with a highly reflective (HR) output mirror was 2.8 mW. Using a slightly lower reflectivity output mirror provided a slope efficiency of only 2.2%.

Thus, in accordance with this inventive concept a continuing need has been found in the state of the art for a high efficiency dye laser which is scalable to higher power, has a low threshold power, is compatible with liquid and solid state dye gain media, can be efficiently pumped by AlGaInP visible laser diodes and can operate either cw or pulsed, where pulsed operation can produce long or short pulses, and these pulses can be emitted between low and high pulse repetition rates.

SUMMARY AND OBJECTS OF THE INVENTION

The present invention is directed to providing a low threshold dye laser which can be efficiently pumped by one or more laser diodes. A laser resonator is composed in its simplest form of an end reflective element and an output coupler reflective element optically aligned to form a reflective path and define a laser resonator cavity. A dye-containing gain element is disposed in the reflective path in the laser resonator cavity, and at least one laser diode emitting at a wavelength between 610 nm and 690 nm is disposed to excite the dye-containing gain element. The dye-containing gain element emits optical radiation when excited by the laser diode, and this radiation resonates in the reflective path in a laser resonator mode. The laser resonator mode converges to a laser resonator mode waist in the laser resonator cavity. The laser resonator mode waist represents the smallest laser resonator mode diameter in the cavity, and the dye-containing gain element is located at or near the position of the laser resonator mode waist to provide high efficiency, low threshold and low loss laser operation. The laser diode emission is focused on or near the dye-containing gain element with a lens or mirror or any other suitable optical elements. The size of the pump beam at the focus, called the pump beam waist, is adjusted by suitable selection of the optical elements used to transport the optical flux from the laser diode to the dye-containing gain element. When the pump beam waist approximately matches the laser resonator mode waist in size and location, high efficiency operation of the dye laser may be achieved. The laser diode and pump optics are disposed for end pumping the dye-containing gain element.

Accordingly, an object of the invention is to provide a low threshold dye laser which can be pumped by laser diodes.

Another object of the invention is to provide an efficient dye laser which converts a high fraction of the incident pump power to laser output power.

Another object of the invention is to provide a tunable, highly efficient, low threshold dye laser that is pumped by laser diodes.

Yet another object of the invention is to provide a diode pump source which can be powered by ordinary flashlight batteries.

Yet another object of the invention is to provide a diode-pumped dye laser that can be scaled to higher pump power by increasing the number of diodes or the power of each laser diode pump.

Another object of the invention is to provide a laser diode-pumped dye laser where the dye laser gain medium is a solid state medium.

Another object of the invention is to provide a laser diode-pumped cw dye laser.

Another object of the invention is to provide a laser diode-pumped pulsed dye laser.

Another object of the invention is to provide a laser diode-pumped pulsed dye laser for which the pulse length is adjustable.

Another object of the invention is to provide a laser diode-pumped pulsed dye laser for which the pulse length is longer than 10 ns.

Another object of the invention is to provide a laser diode pumped dye laser which can be modulated at a high repetition rate.

Another object of the invention is to provide a diode-pumped dye laser which can be efficiently scaled to higher output power by angular multiplexing of laser diodes.

Another object of the invention is to provide a diode-pumped dye laser in which one component of the dye laser serves as both the resonator end reflective element and the focusing lens for the collimated pump flux from the laser diode pump source.

Yet another object of the invention is to provide tunable laser output from a laser diode-pumped dye laser without astigmatism in the output beam.

These and other objects of the invention will become more readily apparent from the ensuing specification and drawings when taken in conjunction with the appended claims.

DETAILED DESCRIPTION OF THE PREFERRED EMBODIMENTS

Figure 1:
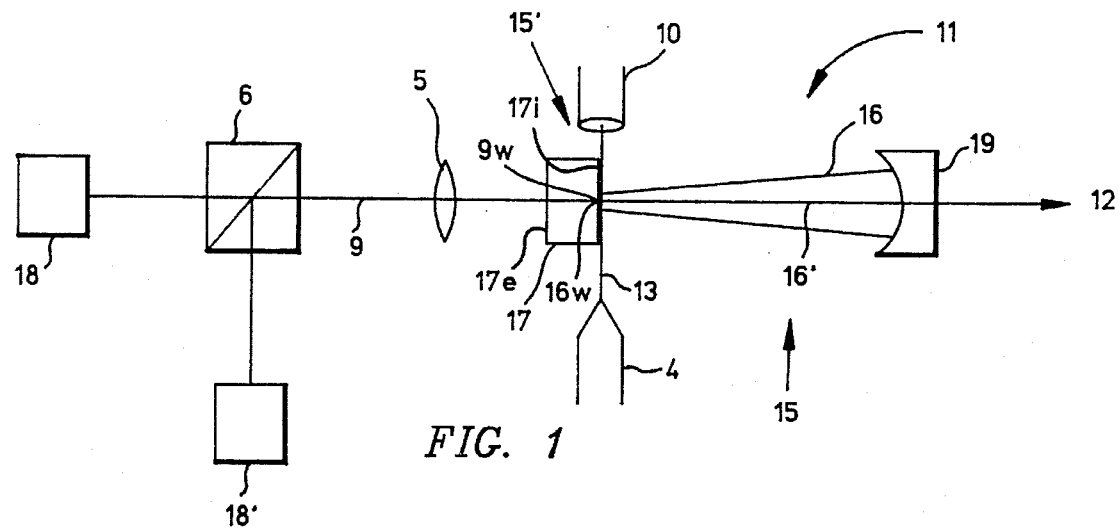
FIG. 1 illustrates a first embodiment of the invention.

This inventive concept involves the implementation of a laser diode-pumped dye laser. The output of the laser is tunable and may be cw or pulsed. The pump laser diodes may either emit cw or pulsed optical radiation. The dye may be placed in an optical cell, it may flow transverse to the laser resonator mode axis as a sheet of fluid in free space by emanating from a high pressure jet nozzle, or it may take the form of a solid state dye-containing gain medium.

The design of the optical laser resonator cavity disclosed herein is generic and can be used in laser systems that are continuously tunable or discretely tunable. In addition, it can be used with gain media that are organic dyes or chelate materials. The laser gain medium may be contained in a flowing sheet of solvent, in an optical thin film placed on a substrate or free-standing within the resonator, or the dye can be dissolved or distributed in a solid state host such as a glass or a gel or a plastic such as PMMA or other suitable polymer host. In general the dye should be distributed uniformly in the host material, independent of whether the host material is a solid state host material or a liquid host such as a solvent.

The recent introduction of visible laser diodes operating at power levels comparable to that produced by commercial krypton ion lasers has provided an opportunity to optically pump organic dye lasers. These diodes produce wavelengths between 610 nm and 690 nm. Their output can be either cw or pulsed; the diodes are small, are convenient to use, require no active cooling, and are inexpensive relative to ion lasers. In general, visible laser diodes are commercially packaged and contain integrated collimating lenses so that the optical emission from the packaged diode is collimated. If a packaged diode is not used, a separate collimating lens or lenses must be supplied by the user if collimated diode output is desired.

The wavelength range over which the laser system operates is determined by the nature of the laser gain element as well as by the reflective coatings and the transmission of the optical elements contained within the laser resonator cavity. The laser resonator cavity can be end pumped or side pumped by laser diodes. End pumping, which is also called longitudinal pumping, describes a means for optically exciting a laser gain element by pumping along the laser resonator axis. The laser resonator axis is the optical feedback axis, and defines the reflective path for intracavity radiation. Side pumping, which is also called transverse pumping, describes a means for optically exciting a laser gain element by pumping transverse to the laser resonator axis.

The laser resonator cavity can be pumped by laser diodes which are angularly multiplexed to form a pumping beam. The laser gain element can be located in any number of orientations within the laser resonator including normal to the laser resonator axis or tilted such that the end faces of the gain medium, whether it is a flowing sheet of dye solution or dye in a solid state matrix or some other embodiment of gain element, are tilted at Brewster's angle.

An element for wavelength dispersion such as a prism can be placed in the reflective path in the laser resonator cavity. Additional mirrors, plain or curved, can be inserted as required to produce various effects. The laser radiation contained within the laser resonator cavity takes the shape of a resonator mode. The cross-section of the resonator mode can be gaussian, and various shapes and spatial contours of modes are available for stable resonators. The most desirable resonator mode is the $TEM_{00}$ mode.

The $TEM_{00}$ mode has a circular cross-section and a gaussian shape through this cross-section, but its diameter can vary throughout the resonator. Various mirrors, lenses and other optical components can be disposed within the laser resonator cavity to produce various beam transformation effects upon the laser resonator mode. For example, the mode can be collimated, the mode can be focused, astigmatism can be introduced into the mode, and astigmatism can be corrected from the mode. When the mode is focused, the focus spot size is called the resonator waist, and the waist dimension refers to the radius of the circular cross-section at the focus point.

When a wavelength dispersive element or elements are introduced into the cavity, it is best to have a collimated laser mode as this produces the highest resolution, the highest wavelength selection and the lowest distortion. On the other hand, for optical pumping it is best to have a resonator waist located within the gain element. This provides the highest extraction efficiency and highest pumping efficiency when the pump beam waist size matches (i.e. is identical in size to) the resonator waist. In addition, when the pump beam waist matches the resonator waist within the gain element and the matching is optimum for the $TEM_{00}$ mode, this creates a "gain aperture" within the gain element and is the most efficient means for selecting $TEM_{00}$ operation.

The smaller the number of optical components contained within the laser resonator cavity, the lower the passive loss. This provides the lowest threshold and highest slope efficiency. To this end the simplest resonator design would be one which consists of two mirrors and a gain element. The resonator mode is configured to be nearly hemispherical, which allows a mode waist to be created in the gain element. An exactly hemispherical mode is unstable, having a mode waist diameter of zero. By slightly reducing the spacing between the two mirrors, a nearly hemispherical laser resonator mode is established. This type of resonator is stable. The gain element is pumped by visible laser diodes. The laser gain element consists of a laser dye, which can be in the form of a fluid dye jet. The dye jet stream is located as close as practical to the highly reflective (HR) flat in the laser resonator. The dye jet is produced by a pump which forces the dye solution, which is contained in a reservoir, through a thin, approximately rectangular aperture nozzle. This produces an interferometrically flat plane of liquid dye that crosses the resonator mode axis. Although the dye jet provides efficient and convenient access to the gain element for cw operation, other configurations for the gain element are possible.

Referring now to the drawings wherein like reference numerals designate identical or corresponding parts throughout the several views, and noting that none of the figures are drawn to scale, FIG. 1 illustrates a first embodiment of this inventive concept. A tunable laser 11 includes a laser gain element 13 in the form of a flowing stream of dye disposed in a laser resonator 15' composed of an end reflective element 17 and an output coupler reflective element mirror 19 optically aligned in a reflective path in laser resonator cavity 15. The laser resonator cavity is bounded by the end reflective element and the output coupler reflector element. Output coupler reflective element 19 is an exemplary 10 cm radius of curvature output mirror while end reflective element 17 is an exemplary HR flat mirror. The spacing between output coupler reflective element 19 and end reflective element 17 is adjusted to provide a nearly hemispherical laser resonator mode 16 in laser resonator cavity 15. Nearly hemispherical laser resonator mode 16 provides a laser resonator mode waist 16w at an interior face 17i of end reflective element 17.

Interior face 17i is coated to be highly reflective at the wavelength contained in laser output 12 while highly transmissive for the pump wavelength from laser diodes 18 and 18'. Laser diodes 18 and 18' are packaged diodes in this exemplary case and emit a collimated output beam due to the inclusion of a collimating lens in the diode package. An exterior face 17e of end reflective element 17 may be uncoated or may be coated to be anti-reflective (AR) at the wavelength emitted by laser diodes 18 and 18'. In general, the wavelength emitted by laser diode 18 is close to but not exactly the same as the wavelength emitted by laser diode 18'. Therefore, coatings that are AR or highly transmissive to the wavelengths emitted by the laser diodes 18 and 18' should cover a spectral range broad enough to contain the entire range of wavelengths emitted by laser diodes that will be pumping laser gain element 13. For AlGaInP laser diodes this wavelength range is approximately 610 nm to 690 nm.

In addition, external face 17e and internal face 17i of end reflective element 17 should be parallel to one another and each should have a high quality optical finish. The surface roughness should be one-tenth wave or better. The spacing between exterior face 17e and interior face 17i should be as small as possible to allow focusing lens 5 to be located as close as possible to laser gain element 13. The focal length of focussing lens 5 is chosen to focus pump beam 9 on or near laser gain element 13. In general, the smaller the focal length of focussing lens 5, the smaller the diameter of the pump beam waist 9w at laser gain element 13. A small pump beam waist is desirable to reduce the threshold pump power for laser operation.

The actual spacing between external face 17e and internal face 17i of end reflective element 17 will be determined in part by the overall dimensions of end reflective element 17. If end reflective element 17 is disc-shaped, then its diameter will determine the minimum thickness. If the aspect ratio, which is the ratio of the diameter to the thickness of end reflective element 17, is too large, then warping, bowing or fracturing of end reflective element 17 will occur. In this exemplary case, end reflective element 17 is 1 inch in diameter, 2 millimeters thick, and is made of high quality fused silica. Furthermore, in this exemplary case, face 17e is uncoated.

The orientation of laser gain element 13 is normal to a laser resonator mode axis 16'. The spacing between interior face 17i of end reflective element 17 and laser gain element 13 must be made as short as possible for several reasons. One is to provide mode matching of reflected resonator mode radiation at each air-dye jet interface. Another is to provide optimum extraction efficiency by allowing the laser resonator mode waist, which is generally located at or near the end reflective element, and the pump beam waist, which is generally located at the gain element, to approximately coincide. Yet another reason is to allow the use of the shortest possible focal length for the focusing lens.

For a solid state gain element, the gain element can essentially abut the end reflective element. For a gain element in the form of a dye jet, the spacing between the end reflective element and the gain element must be large enough to prevent splashing of dye solution on the interior face of the end reflective element. In addition, the end reflective element cannot physically interfere with the flow of the dye jet. In this exemplary case the spacing between interior face 17i and laser gain element 13 is approximately 400 μm.

Any type of laser diode can be used for laser diode 18 and 18'. In this exemplary case two laser diodes (18 and 18') are used to optically excite laser gain element 13. The output of each diode is collimated and the polarization of the output from laser diode 18 is oriented 90° with respect to the polarization of the output of laser diode 18'. This allows combination of the output of laser diode 18 and laser diode 18' by a polarization beam combiner cube 6.

Polarization beam combiner cube 6 and laser diodes 18 and 18' are aligned, adjusted and oriented so that a single pump beam 9 emerges from polarization beam combiner cube 6. Pump beam 9 contains the spectral emission from laser diode 18 and laser diode 18' and contains crossed polarizations.

The thickness of laser gain element 13 in this exemplary case is 100 μm. The thickness in this case is the dimension of the gain element along the laser resonator mode axis. The dye jet thickness of laser gain element 13 is a function of the dye solution temperature, the dye pressure and the physical dimensions of dye nozzle 4, among other things. Catch tube 10 is oriented to receive the jet stream produced by dye nozzle 4. The dye solution is transported by catch tube 10 back to a dye reservoir, not shown.

There are several significant benefits of using laser resonator 15', illustrated in FIG. 1, when low threshold operation is an important consideration. For one, laser diode pump beam 9 is coincident with laser resonator mode axis 16'. In this orientation, known as longitudinal or end pumping, the pump beam can be focused with a very short focal length lens 5, resulting in a small pump beam waist 9w at laser gain element 13. Pumping gain element 13 at an angle with respect to laser resonator mode axis 16', as is done in many commercial cw dye lasers, would require a longer focal length lens. A longer focal length lens would be required since the lens diameter would partially eclipse laser resonator mode 16 if the lens working distance were too short. In addition, a non-normal angle of incidence for pump beam 9 relative to laser gain element 13 would produce an elliptical pump spot and, consequently, reduced pump power density.

An additional benefit of longitudinal pumping is that pump beam waist 9w can be mode matched to the laser resonator mode waist at laser gain element 13. Mode matching means that the size of pump beam waist 9w is the same as the size of resonator mode waist 16w. Many of the benefits of mode matching are realized when the two waist sizes are approximately but not exactly the same size. In this case the two waists are said to be "substantially mode matched". In the case where the spacing between laser gain element 13 and interior face 17i of end reflective element 17 is small (approximately 1% or less of the 100 mm exemplary spacing between output coupler reflective element 19 and interior face 17i of end reflective element 17), unabsorbed pump power reflected by output coupler reflective element 19 will be focussed on laser gain element 13 with a focal spot size approximately equal to the size of pump beam waist 9w. Output coupler reflective element 19 is provided with a coating that is HR at the pump wavelengths contained in pump beam 9 and simultaneously partially reflective at the wavelengths contained in laser output 12. Double pass absorption allows good power deposition in laser gain element 13 at a lower dye concentration than would be required if power deposition occurred in a single pass. Since the passive loss of the dye gain element increases with increasing dye concentration, it is desirable to use as low a concentration as practical. As a practical consideration, the dye laser concentration is adjusted to allow approximately 80% to 90% of the incident pump power to be absorbed by the dye gain element. This provides efficient utilization of the optical pump power.

The plane of laser gain element 13 is oriented orthogonal to laser resonator mode axis 16'. This reduces the laser threshold power requirements as compared to the more traditional Brewster orientation of the laser gain element with respect to the laser resonator mode axis, since both the pump power density and extraction efficiency increase as the pump and resonator mode areas decrease. Also, although laser resonator mode 16 undergoes reflections at both of the air-dye jet interfaces owing to the non-unity refractive index of the dye solvent, these reflections are substantially mode matched and do not add to the resonator loss. In this regard, substantially mode matched means that the mode reflected by each interface approximately matches the resonator mode in terms of size, divergence and angular orientation. Minimizing the spacing between laser gain element 13 and end reflective element 17 therefore provides the best mode matching for reflected radiation as well as allowing the use of a lens with the shortest possible focal length.

Optimizing the performance of tunable laser 11 requires that the dye concentration be optimized. The dye optimization procedure is based on in situ measurements of the pump light transmission using the specific laser resonator and pump wavelengths. When AlGaInP visible laser diodes are used, the initial dye concentration can be similar to that reported in various commercial manuals for pumping with krypton ion lasers. The dye concentration is then adjusted as the dye laser is operating by adding more solvent or more concentrated dye solution (as appropriate) to the dye solution circulating within tunable laser 11. Optimization is monitored by observing the change in the threshold power requirement under diode pumped operation. In the exemplary case illustrated in FIG. 1 it was found that the optimum concentration was one that allowed 70% of the pump wavelength to be absorbed in a single pass.

Laser measurements with the laser resonator illustrated in FIG. 1 were performed; see R. Scheps, *IEEE Photonics Technology Letters*, vol. 5, p. 1156, 1993. In this exemplary case the dye rhodamine 700 was used, dissolved in ethylene glycol. Laser diode 18 emitted radiation at 672 nm and laser diode 18' emitted radiation at 674 nm. The coating on interior face 17i of end reflective element 17 was HR from 720 nm to 850 nm and highly transmissive (HT) from 650 nm to 680 nm. Output coupler reflective element 19 was coated HR at 650 nm to 680 nm and was partially reflective from 700 nm to 800 nm. To achieve a low laser threshold power, output coupler reflective element 19 was coated HR from 700 nm to 800 nm. The optimum dye concentration in this exemplary case was $1.76 \times 10^{-3}$ molar (M). The dye solution was maintained at 12° C., although operation of tunable laser 11 was found to be independent of dye solution temperature between 10° C. and 20° C.

Figure 2:
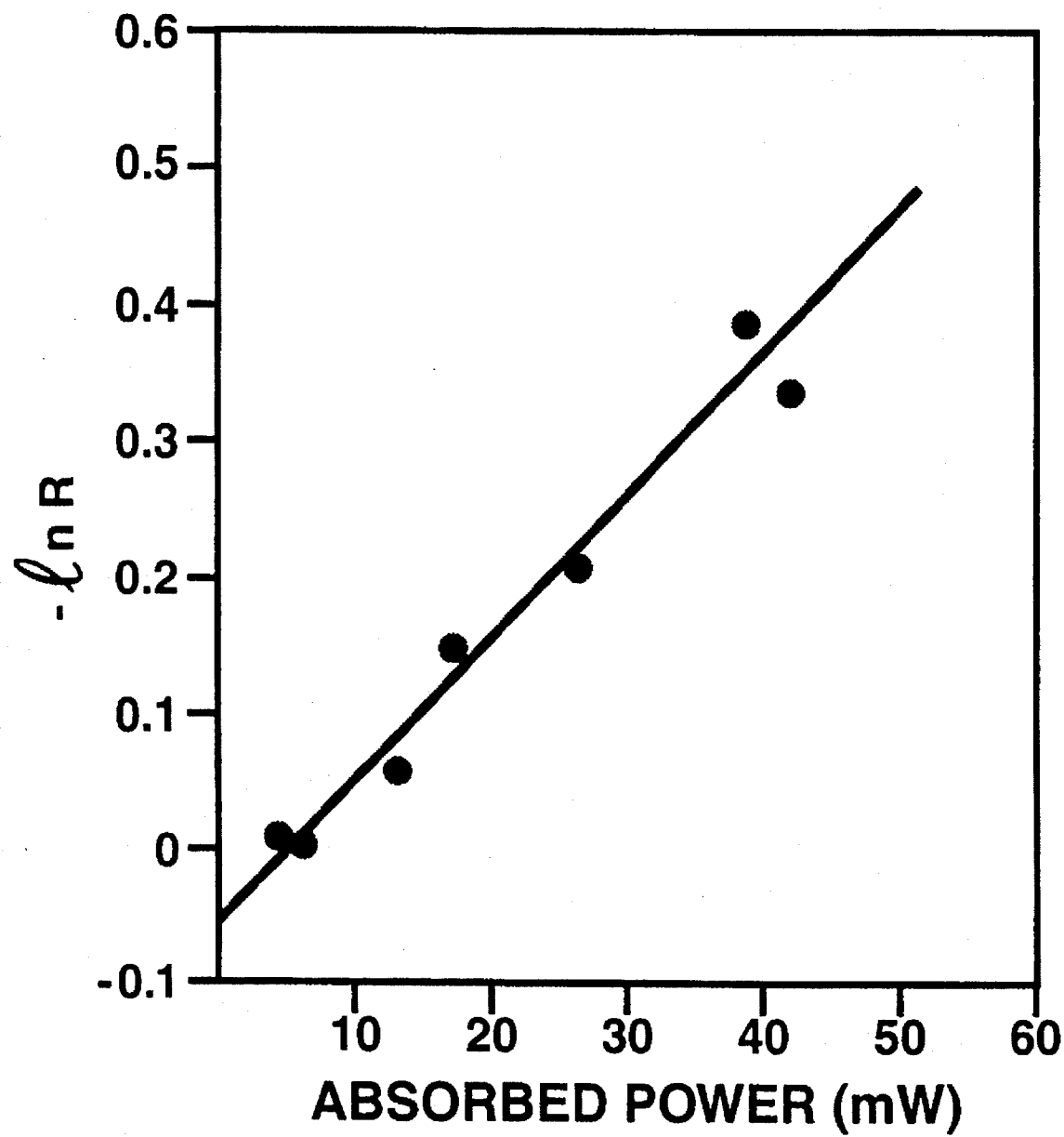
FIG. 2 shows the Findlay-Clay data for rhodamine 700 dye.

An analysis of the passive losses of laser resonator 15' were measured by means of a Findlay-Clay analysis and indicated a loss of $2.75 \times 10^{-3}$ per pass. The low loss value confirms the fact that Fresnel reflections at the air-dye jet interfaces are mode matched, as the reflectivity from each of these surfaces for laser resonator mode 16 is 0.04 per surface or 0.08 per single pass. The Findlay-Clay data are illustrated in FIG. 2, where the threshold pump power is plotted as a function of the reflectivity of output coupler reflective element 19. FIG. 2 illustrates the low threshold power produced by the laser design shown in FIG. 1. The lowest absorbed threshold power was 5.6 mW and was obtained using output coupler reflective element 19 that was HR coated between 700 and 800 nm. A 14 mm focal length focusing lens was used and produced a pump spot diameter that was 36 µm on laser gain element 13. The absorbed pump power density at threshold is therefore approximately 550 W/cm$^2$.

The untuned laser output peak wavelength was located at 758 nm in this exemplary case and the full width half maximum of the output band was 16 nm. The maximum output power obtained was 0.28 mW and the slope efficiency was 16% under diode pumped operation. Laser diodes 18 and 18' in this exemplary case each emitted 10 mW and the total power in pump beam 9 incident on laser gain element 13 was approximately 13 mW. Under diode pumped operation four AA batteries were used to drive the laser diodes. No cooling of the laser diodes was required. As laser gain element 13 in this case was configured as a dye jet, AC electrical power was required for the pump which circulated and pressurized the dye solution. In addition, the solution was cooled with a thermoelectric cooler in this exemplary case. In general, however, if a non-flowing gain element is used, such as a dye-containing polymer host, then additional electrical power would not be required. In this case the dye laser would operate using only the AA batteries required to drive the laser diodes.

Figure 3:
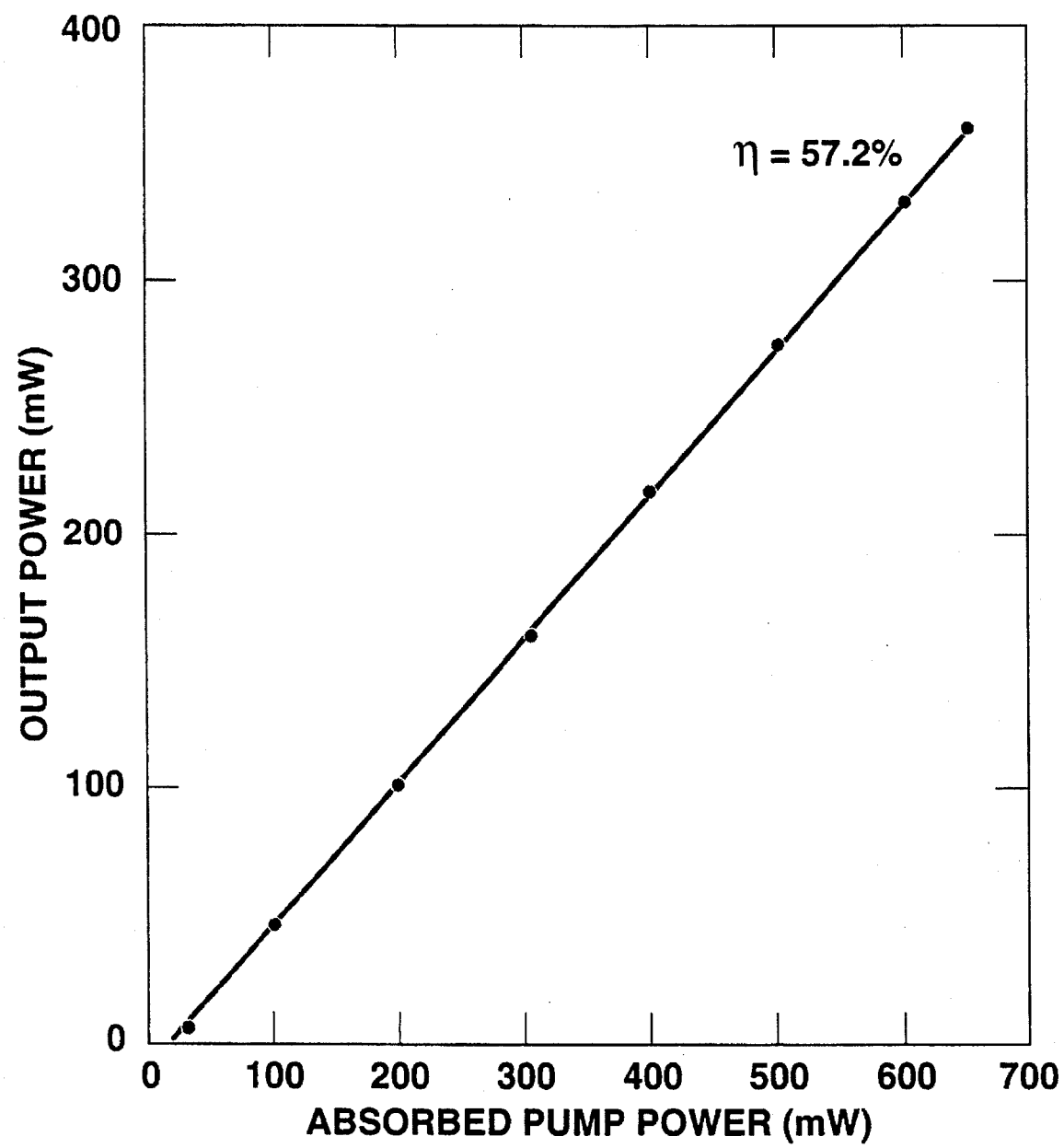
FIG. 3 shows the output power dependence on pump power for rhodamine 700.

To determine the scalability to higher power of tunable laser 11 illustrated in FIG. 1, a DCM-based dye laser pump source was substituted for laser diodes 18 and 18' and was used in conjunction with a 0.985 reflective output coupler reflective element 19. With a total absorbed power of 571 mW a slope efficiency of 57.2% was obtained. The optical conversion efficiency was 49% and the output power was 361 mW at 742 nm. The power data are illustrated in FIG. 3.

Figure 4:
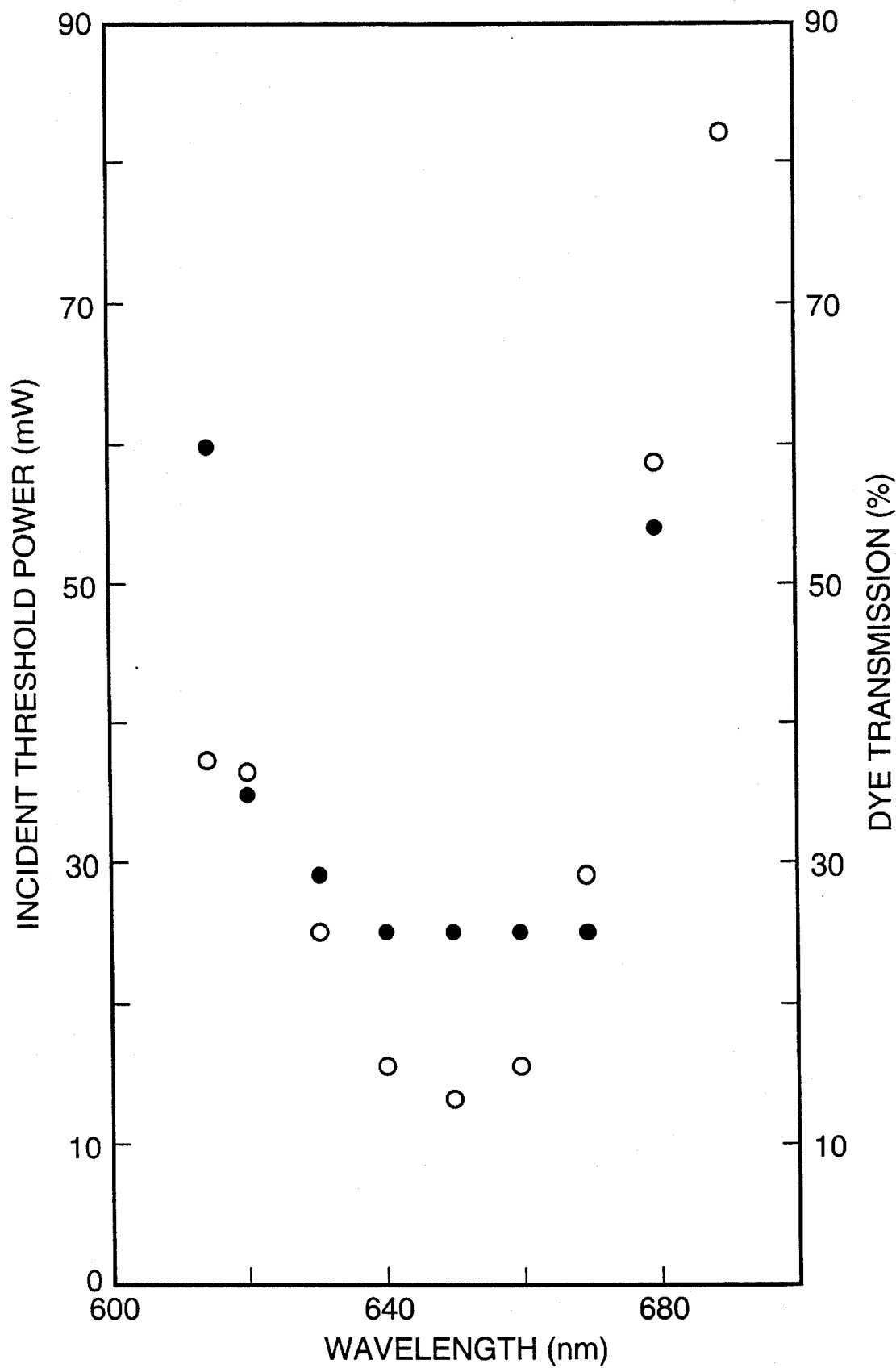
FIG. 4 shows the variation of dye transmission and threshold power with pump wavelength for rhodamine 700.
Figure 5:
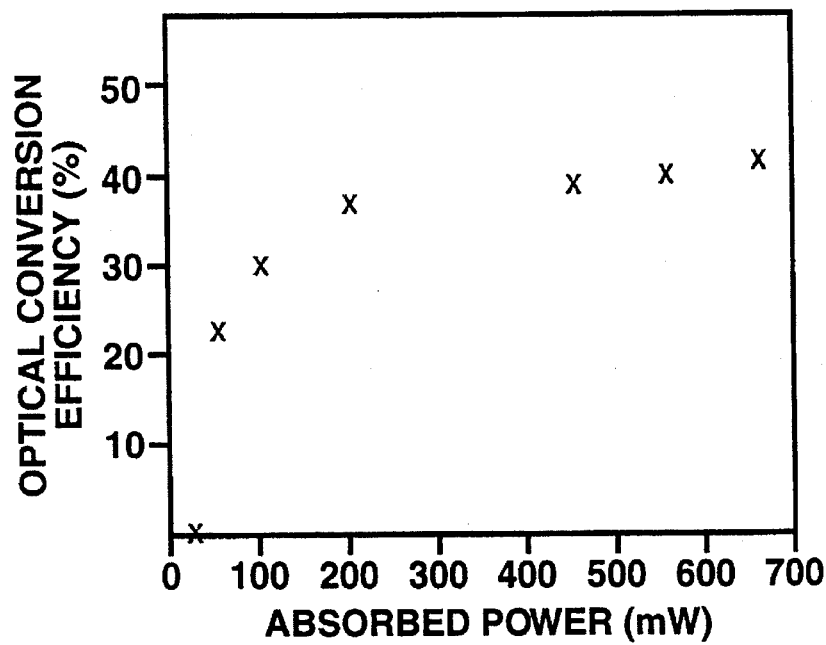
FIG. 5 shows the variation in optical conversion efficiency with pump power for rhodamine 700.

Using the DCM pump laser, the threshold power as a function of pump wavelength was determined using a 96% reflective output coupler reflective element 19. This measurement shows the beneficial effect of double-pass absorption on threshold operation of the dye laser. At wavelengths for which the dye transmission is below 30%, the threshold power was constant at 25 mW. For the concentration of rhodamine 700 used in this exemplary case, this covers a wavelength range of 640 nm to 670 nm. FIG. 4 illustrates the dye transmission (open circles, right hand ordinate) and the threshold power (filled circles, left hand ordinate) as a function of wavelength. The optical conversion efficiency, which is the fraction of incident pump power converted to dye laser output power, is a function of the pump power. For rhodamine 700 the optical conversion efficiency is over 40% when the incident pump power is above 200 mW. The optical conversion efficiency as a function of pump power is shown in FIG. 5.

In this exemplary case the dye laser output wavelength is sensitive to the spectral dependence of the reflectivity of both end reflective element 17 and output coupler reflective element 19. For various coatings placed on output coupler reflective element 19 the central wavelength shifted over a range of 14 nm in this exemplary case. This is a result of the laser providing the greatest amplification at a wavelength which provides the highest net gain. The free-running bandwidth of laser output 12 also changes as the central wavelength shifts.

For applications where a specific wavelength is desired within the tuning bandwidth of a particular dye, the optical elements including output coupler reflective element 19 and end reflective element 17 can be coated in such a manner that the net gain for a single pass through laser resonator cavity 15 is peaked at the desired wavelength. Therefore, no additional tuning elements are required within laser resonator cavity 15. A limitation to this technique is that in order to change the output wavelength contained in laser output 12 the coated optical elements would have to be replaced. For applications where continuous tunability is desired, insertion of a discrete tuning element is a more appropriate approach.

Other dyes with different spectral properties are utilizable in tunable laser 11 illustrated in FIG. 1. Three other dyes, oxazine 750, DOTCI, and oxazine 1, have been demonstrated. It should be noted that terminology for dyes varies among dye manufacturers and common synonyms for the dyes demonstrated are: LD 700 for rhodamine 700, oxazine 725 for oxazine 1 and DOTC or DOTC-iodide for DOTCI.

Some dyes are not as efficient laser gain media as others for numerous reasons, including quenching, triplet-state absorption, intersystem crossing, excited state absorption and other phenomena well known in the literature; see, for example, Duarte and Hillman, *Dye Laser Principles with Applications*. The optimum concentration for oxazine 750 when used in tunable laser 11 was $6.44 \times 10^{-4}$M. The threshold power was 10 mW, the single pass loss was $16 \times 10^{-3}$, the best slope efficiency was 18% and the highest optical conversion efficiency obtained was 15%. Using the dye DOTCI in tunable laser 11 the optimum dye concentration was $3.55 \times 10^{-4}$M, the lowest incident threshold was 10 mW and the single pass loss was $4 \times 10^{-3}$. The best slope efficiency obtained was 17% and the highest optical conversion efficiency was 16%. Both of these dyes operated under diode pumping in the embodiment illustrated in FIG. 1 using two polarization combined laser diodes. Neither of these dyes, however, were as efficient as rhodamine 700.

Figure 6:
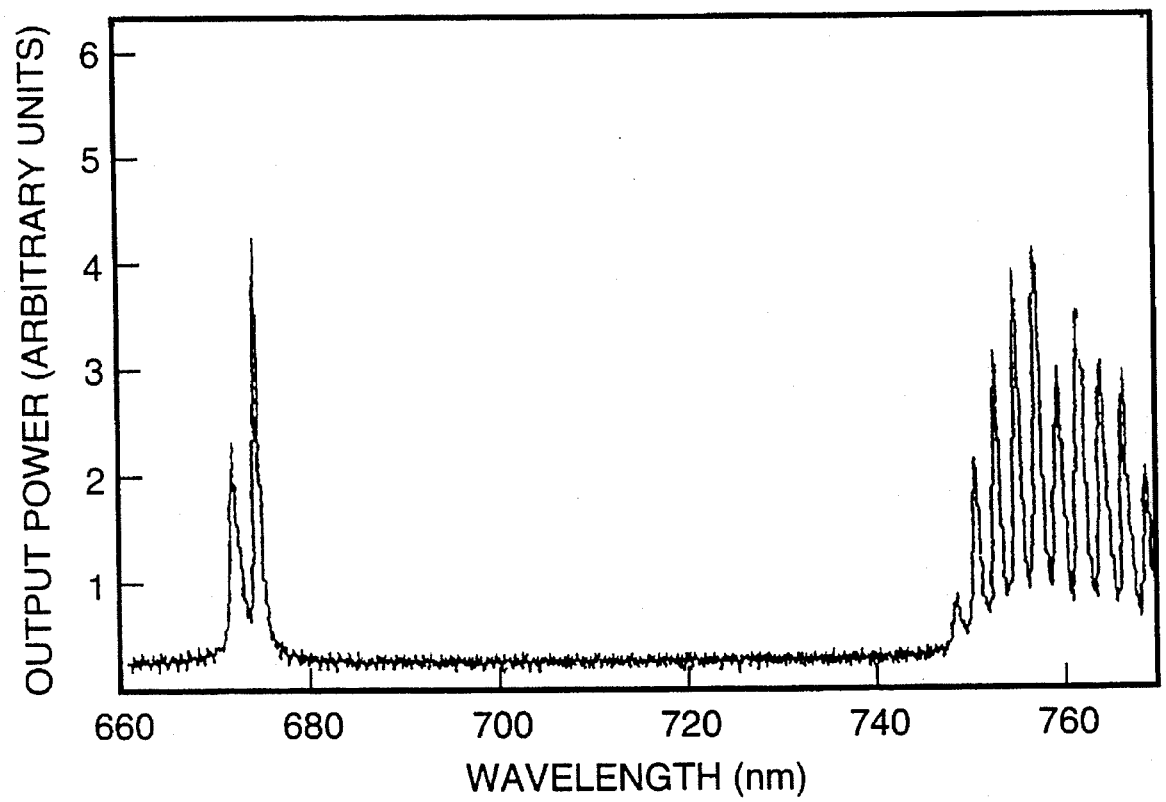
FIG. 6 shows the spectral output of the dye laser operating with oxazine 1 dye.

The dye oxazine 1 operated as efficiently as rhodamine 700. The optimum dye concentration for pumping with laser diodes 18 and 18' was $1.81 \times 10^{-3}$M. The oxazine 1 dye laser threshold was low enough at this concentration to allow laser operation when pumping with only one of the two laser diodes, in this exemplary case laser diode 18'. Under laser diode pumping, the maximum output power transmitted through HR output coupler reflective element 19 was 334 µW. Note that a comparable amount of power is emitted through HR end reflective element 17. The central wavelength was 760 nm. The dye laser output is illustrated in FIG. 6, which shows the broadband spectral output from the dye laser at 760 nm as well as the pump wavelengths corresponding to laser diodes 18 and 18'.

Figure 7:
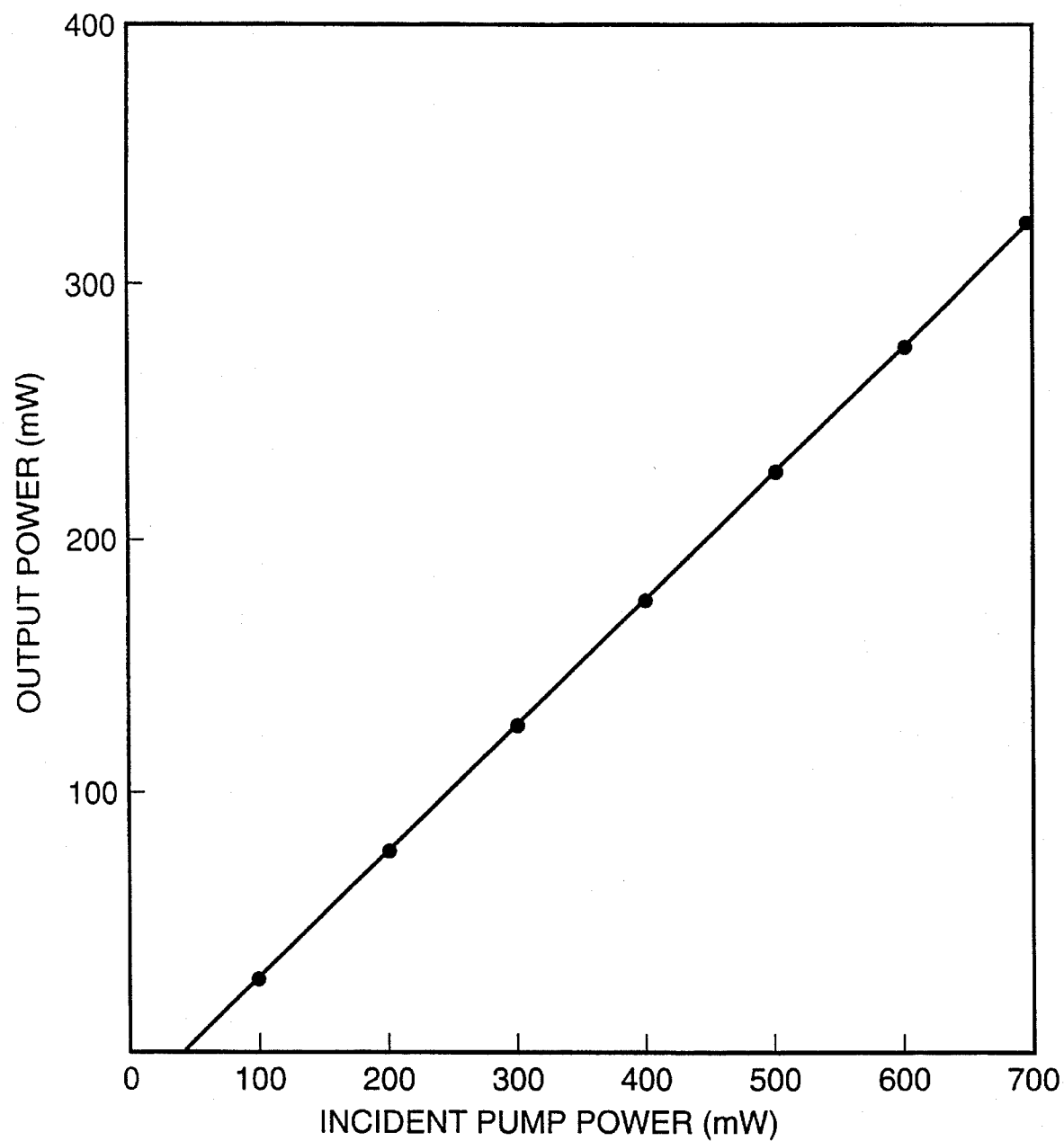
FIG. 7 shows the output power variation with pump power for oxazine 1.

The single pass loss was measured to be $3.3 \times 10^{-3}$. Oxazine 1 dye losses decrease as the temperature decreases, and the best operation was obtained at the minimum temperature used, which in this exemplary case is 8° C. Using the DCM dye laser as a pump source, the maximum output power was 324 mW and was obtained with a 98% reflective output coupler reflective element 19. The slope efficiency was 49.4% and the optical conversion efficiency was 46%. The dependence of the output power on pump power is illustrated in FIG. 7.

The performance of tunable laser 11 using four different dyes is summarized in Table 1 below.

TABLE 1

| Dye | Threshold power (mW) | Loss $\times 10^3$ | Slope efficiency (%) |
|---|---|---|---|
| rhodamine 700 | 6.6 | 5.4 | 57 |
| Oxazine 750 | 10.0 | 3.2 | 18 |
| DOTCI | 10.0 | 8.0 | 17 |
| oxazine 1 | 5.4 | 6.6 | 49 |

The passive loss for each resonator is primarily due to reflections at the air-dye jet interface. The loss measured for the four dyes is similar, which by itself is a strong indication that most of the loss is not related to factors specific to the individual dyes. The distributed passive loss can be estimated. The accuracy of the spectrophotometer places an upper limit on the absorption at the laser emission wavelength. For oxazine 1 this is 10 L/Mole-cm. In this case the contribution to the total loss is due to dye absorption at 760 nm is $8.3 \times 10^{-4}$, or about 13% of the total passive loss. This corresponds to a linear loss of 4% per centimeter. The residual, non-distributed loss for oxazine 1 is $5.8 \times 10^{-3}$ and is due primarily to reflections at the air-dye jet interfaces. The residual losses for the other dyes can be calculated as well, and are $4.6 \times 10^{-3}$, $2.9 \times 10^{-3}$ and $7.8 \times 10^{-3}$ for rhodamine 700, oxazine 750 and DOTCI, respectively. The variation of the residual loss among the dyes in this exemplary case is due to small variations in the resonator alignment, particularly the spacing between optical gain element 13 and end reflective element 17. In addition, some of the variation is due to the accuracy of the loss determination method which uses a Findlay-Clay determination; see D. Findlay and R. A. Clay, *Physics Letters*, vol. 20, p. 277, 1966.

Figure 8:
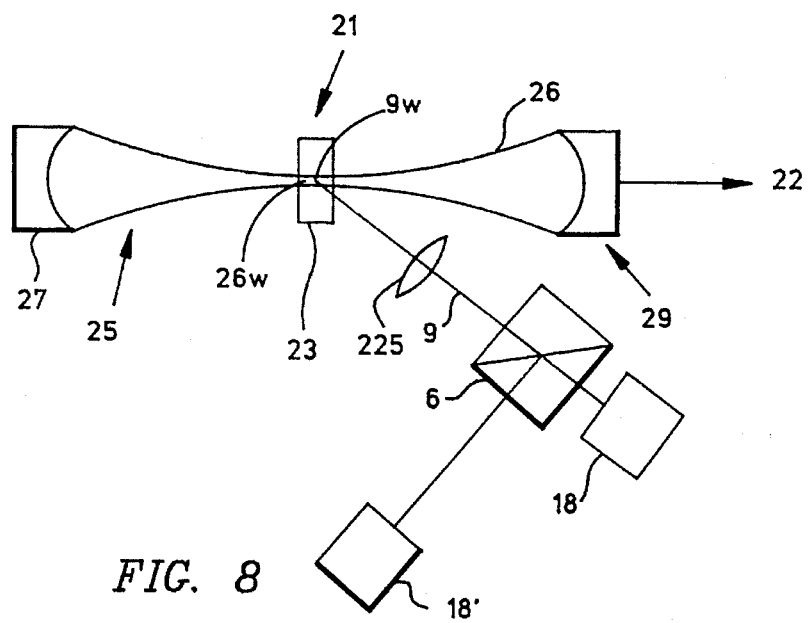
FIG. 8 illustrates a second embodiment of the invention.

A second embodiment of this inventive concept is illustrated in FIG. 8. In this embodiment a nearly concentric laser resonator mode 26 is established in laser resonator cavity 25 of tunable laser 21. End reflective element 27 is a concave mirror, and output coupler reflective element 29 is also concave. The spacing between end reflective element 27 and output coupler reflective element 29 is adjusted to produce a nearly concentric resonator mode. Laser resonator mode waist $26w$ is produced within laser resonator cavity 25, and laser gain element 23 is located at or near laser resonator mode waist $26w$. In this configuration reflections of laser resonator mode 26 as the mode enters laser gain element 23 in either direction are mode matched. Laser output 22 is emitted through output coupler reflective element 29 of tunable laser 21. In the embodiment of the inventive concept illustrated in FIG. 8, longitudinal pumping is inefficient as it would require a long focal length lens. Therefore, laser pump beam 9, which is produced by laser diodes 18 and 18' and polarization beam combiner cube 6 in this exemplary case, is incident on laser gain element 23 at an angle and is focused by focusing lens 225. Pump beam 9 and focusing lens 225 are aligned and adjusted so that pump beam waist $9w$ is coincident with laser resonator mode waist $26w$. End reflective element 27 is coated HR at the wavelengths contained in laser output 22, while output coupler reflective element 29 is coated for partial reflectivity at these same wavelengths.

Figure 9:
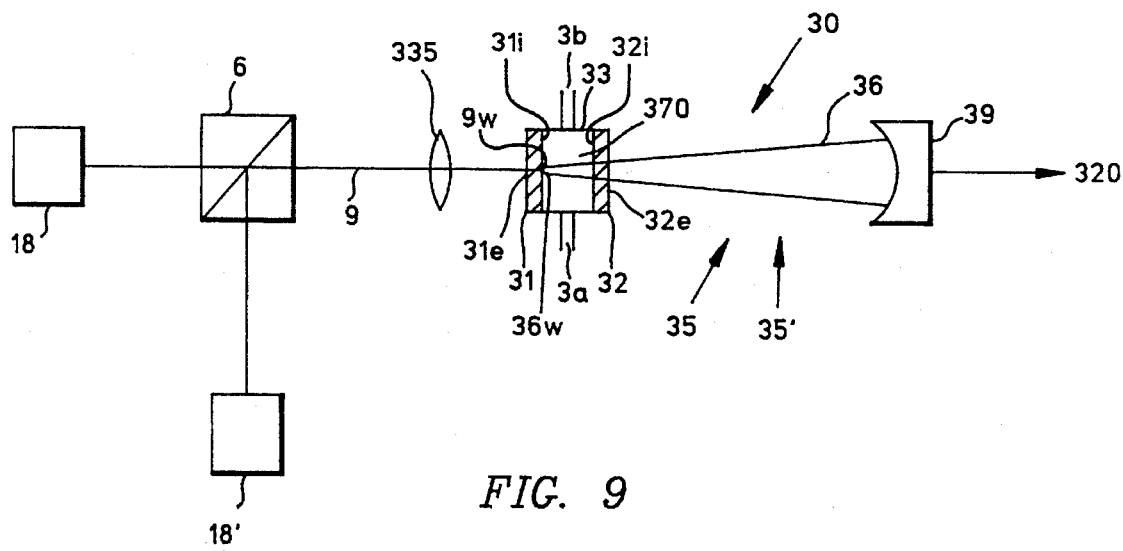
FIG. 9 illustrates a third embodiment of the invention.

A third embodiment of this inventive concept is illustrated in FIG. 9. In this case tunable laser 30 has a dye solution located in dye cell 33. Dye cell 33 contains two windows: 31 and 32. The interior face $31i$ of window 31 has a dichroic coating which is HR at the wavelength of laser output beam 320 emitted through output coupler reflective element 39, and highly transmissive at the pump wavelength of pump beam 9 produced by laser diodes 18 and 18' and polarization beam combiner cube 6 in this exemplary case. The exterior face $31e$ of window 31 may be uncoated, or coated to be anti-reflective (AR) at the pump wavelengths contained in pump beam 9. Interior face $31i$ of window 31 serves as the end reflective element for the laser resonator in the embodiment illustrated in FIG. 9. The interior face $32i$ of window 32 may be uncoated, while the exterior face $32e$ of window 32 is coated to be anti-reflective at the laser wavelengths contained in laser output 320.

Dye cell 33 and output coupler reflective element 39 compose a laser resonator 35' of tunable laser 30. The spacing between output coupler reflective element 39 and interior face $31i$ of window 31 is adjusted to establish a nearly hemispherical laser resonator mode 36 within laser resonator cavity 35. Focusing lens 335 is disposed to establish a pump beam waist $9w$ at or near interior face $31i$ of window 31. Pump beam waist $9w$ is approximately coincident with, or substantially matched to, laser resonator mode waist $36w$, which is located at or near interior face $31i$ of window 31. The solvent for the dye contained in dye cell 33 can be selected so that its refractive index matches the refractive index of the optical material which composes window 32. Therefore, Fresnel reflections at the dye solution-window 32 interface will be negligible, and no AR coating is required on interior face $32i$. If such index matching is not suitable, an AR coating should be placed on interior face $32i$ of window 32.

As coatings on interior face $31i$ or $32i$ may be adversely affected by contact with the dye solution contained in dye cell 33, matching the dye solvent index to the refractive index of the substrate used for windows 31 and 32 is preferable to coating the interior face. If face $31i$ is not coated, face $31e$ can be coated HR for the wavelengths contained in laser output 320 and HT for the wavelengths contained in pump beam 9.

Dye solution 370 can be static in dye cell 33 or it can be forced to flow through tubes $3a$ and $3b$ to effect a continuous replenishing of the dye solution contained within dye cell 33. If the dye solution in cell 33 is flowed, the flow must be regulated to create no index inhomogeneities and must provide an optically clear path for laser resonator mode 36. Otherwise, laser operation will be inefficient or may not occur at all. Output coupler reflective element 29 is coated HR at the wavelengths contained in pump beam 9, and partially reflective at the wavelengths contained in laser output beam 320.

Figure 10:
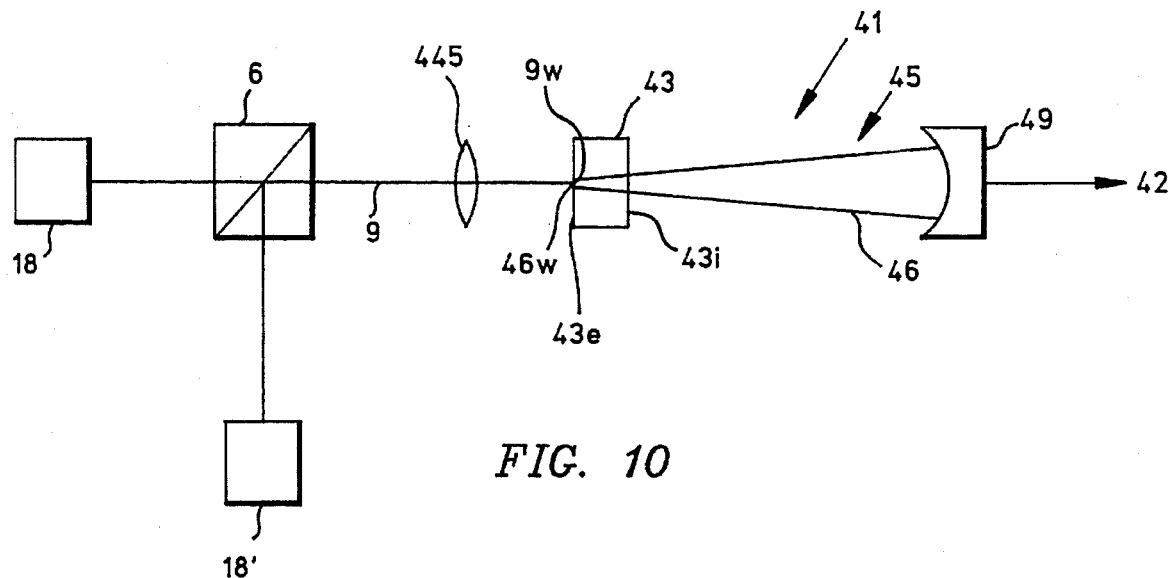
FIG. 10 illustrates a fourth embodiment of the invention.

A fourth embodiment of this inventive concept is illustrated in FIG. 10. In this case, tunable laser 41 consists of a solid state dye gain element 43 and an output coupler reflective element 49. Gain element 43 can take a number of different forms, including a thin film on a substrate, a free-standing thin film, a dye-containing plastic or polymer host, a dye-containing glass or glass-like host, or a dye-containing gel or gel-type host. An example of a gel is the commercial product "Jello". In addition, the gel or gel-type host which is impregnated with a dye may be free standing or disposed on a substrate or sandwiched between optical substrates.

The exterior face 43e of optical gain element 43 has a dichroic coating that is HR at the wavelengths contained in laser output beam 42, emitted through output coupler reflective element 49, and highly transmissive for the wavelengths contained in pump beam 9, emitted by laser diodes 18' and 18 and combined by polarization beam combiner cube 6 in this exemplary case. Output coupler reflective element 49 is coated HR for the wavelengths contained in pump beam 9 and partially reflective for the wavelengths contained in laser output beam 42.

Focusing lens 445 creates pump beam waist 9w located at or near exterior face 43e. Output coupler reflective element 49 is a concave mirror reflective element in this exemplary case located and spaced from exterior face 43e of gain element 43 to provide a nearly hemispherical laser resonator mode 46 in laser resonator cavity 45. Laser resonator mode waist 46w is located at or near exterior face 43e and pump beam waist 9w is aligned and located to approximately coincide with or substantially match resonator mode waist 46w. Interior face 43i of laser gain element 43 is AR coated for laser emission wavelength 42.

Figure 11:
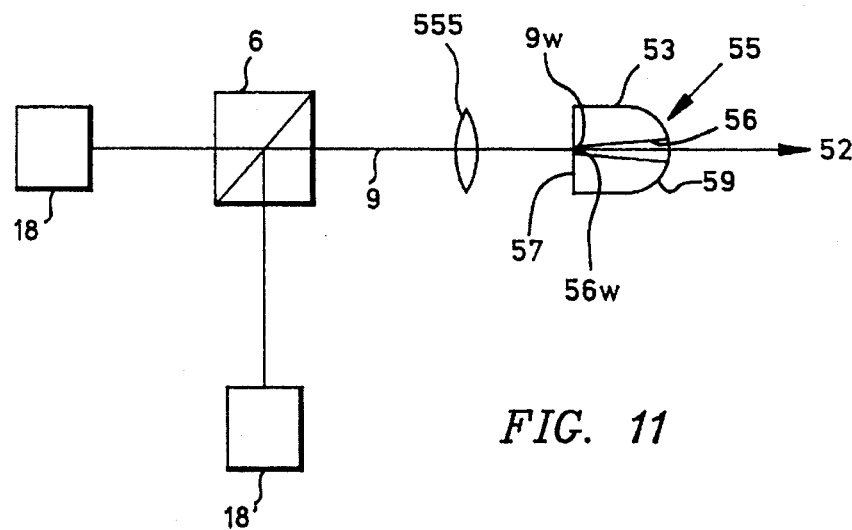
FIG. 11 illustrates a fifth embodiment of the invention.

FIG. 11 illustrates a fifth embodiment of this inventive concept. In this case, laser gain element 53 is a dye-containing solid state material and is designed to form a completely monolithic laser resonator 55. Face 57 of laser gain element 53 may be flat and is coated with a dichroic coating. This dichroic coating is HR at the wavelengths of laser output beam 52 that are emitted through face 59 of laser gain element 53, and highly transmissive at the wavelengths contained in pump beam 9 that is produced by laser diodes 18' and laser diode 18, combined by polarization beam combiner cube 6, and focused by focusing lens 555.

Face 59 of laser gain element 53 may be curved to form a convex spherical surface, as illustrated in FIG. 11, or face 59 may be flat. Face 59 is coated HR for the wavelengths contained in pump beam 9 and partially reflective for the wavelengths contained in laser output beam 52. If face 59 is convex, the length of laser gain element 53 may be chosen in conjunction with the radius of curvature of face 59 to provide a nearly hemispherical laser resonator mode 56 within laser gain element 53. Nearly hemispherical laser resonator mode 56 has mode waist 56w at or near face 57 of laser gain element 53. Focusing lens 555 and laser diode pump beam 9 are aligned to produce pump beam waist 9w that is approximately coincident with or substantially matched to laser resonator waist 56w. If face 59 is flat, it should be parallel to face 57. The separation between faces 57 and 59 should be selected to provide absorption of 80% to 90% of the power in pump beam 9 by laser gain element 53. This separation will be determined in part by the nature and concentration of the dye contained in laser gain element 53.

Figure 12:
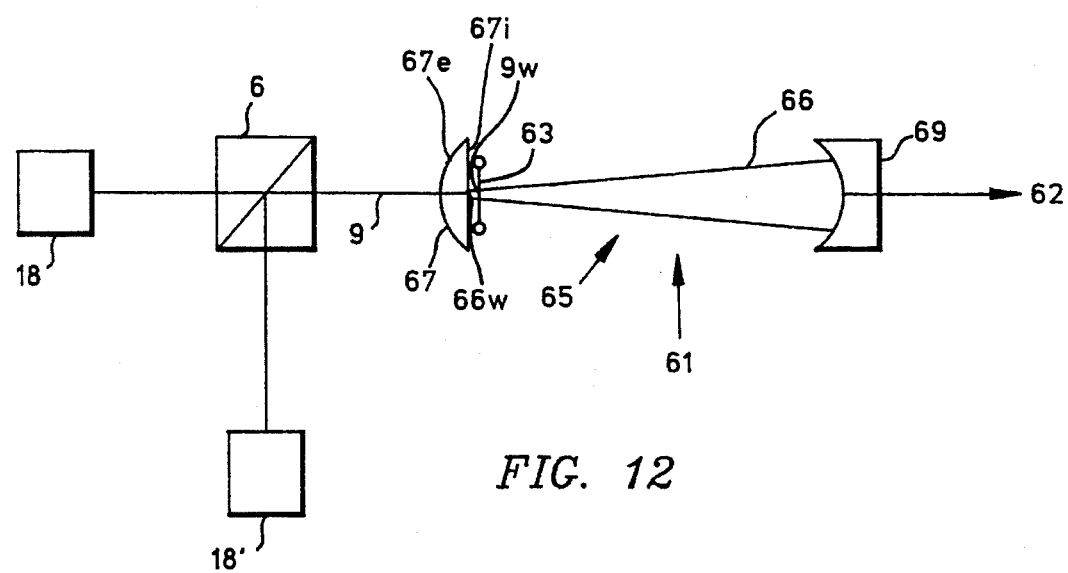
FIG. 12 illustrates a sixth embodiment of the invention.

FIG. 12 represents a sixth embodiment of this inventive concept. A smaller pump beam waist provides for more efficient laser operation and a lower laser threshold power. Because of limitations discussed previously, it is not possible to make end reflective element 17 in FIG. 1, for example, arbitrarily thin to allow the use of an extremely short focal length lens. In FIG. 12, lens element 67 performs the functions of both focusing lens 5 and end reflective element 17 of the embodiment illustrated in FIG. 1.

Lens element 67 can be a plano convex lens with a short focal length. Interior face 67i of lens element 67 has a dichroic coating. This dichroic coating is HR at the wavelengths of laser output beam 62 that are emitted through output coupler reflective element 69 of tunable laser 61, and highly transmissive for pump wavelengths of pump beam 9 that are emitted by laser diodes 18' and 18 and combined by polarization beam combiner cube 6 in this exemplary case. Exterior face 67e of plano convex lens element 67 is AR coated for the laser diode pump wavelengths contained in laser diode pump beam 9.

The separation between output coupler reflective element 69, which has a concave face, and interior face 67i of plano convex lens element 67 is adjusted to create a nearly hemispherical laser resonator mode 66 in laser resonator cavity 65. Laser resonator mode waist 66w is located at or near interior face 67i and pump beam waist 9w approximately coincides with or is substantially matched to laser resonator mode waist 66w. Laser gain element 63, which may be a laser dye jet or a dye-containing solid state material, for example, is located as close as possible to interior face 67i of plano convex lens element 67. This is done so that reflections of laser resonator mode 66 at each of the gain element-air interfaces will be mode matched and will not introduce excessive passive loss.

Although shown as a single element lens in FIG. 12, lens element 67 may be a compound lens, consisting of several lens elements. If composed of several lens elements, lens element 67 should have a short focal length and a flat surface 67i. Output coupler reflective element 69 is coated HR for the wavelengths contained in pump beam 9 and partially reflective for the wavelengths contained in laser output beam 62.

To produce the most versatile dye laser possible both wavelength tuning and power scaling must be accommodated in the laser resonator design. The appropriately designed dye laser resonator contains a region where the resonator mode is collimated to permit the insertion of a tuning prism, a birefringent filter or other wavelength tuning means. This can be accomplished while retaining the highly efficient end pumped characteristics of the laser resonator illustrated in FIG. 1 by the embodiment illustrated in FIG. 13. In this embodiment, tunable laser 71 includes a laser gain element 73 disposed in a laser resonator 75' including an optically aligned end reflective element 17, concave fold reflective element 77 and output coupler reflective element 79 in a reflective path defining laser resonator cavity 75. Laser resonator mode 76 is collimated between concave fold reflective element 77 and output coupler reflective element 79. In addition, laser resonator mode 76 is focused to produce laser resonator mode waist 76w at or near interior face 17i of end reflective element 17. Gain element 73 is located as close as possible to interior face 17i of end reflective element 17.

The concave face 77c of concave fold reflective element 77 is coated HR at the wavelengths contained in laser output beam 72 emitted through output coupler reflective element 79, and is HR for the wavelengths contained in laser diode pump beam 9. Interior face 79i of output coupler reflective element 79 is a partial reflector for the laser wavelengths contained in laser output beam 72 and also is highly reflective for the wavelengths contained in pump beam 9. Interior face 17i of end reflective element 17 has a dichroic coating that is highly transmissive for the wavelengths contained within pump beam 9 and, simultaneously, highly reflective for the dye laser output wavelengths contained in laser output beam 72. Pump beam 9 is composed of the output of laser diodes 18' and 18 which are polarization combined by polarization beam combiner cube 6 in this exemplary case. Pump beam 9 is focused by lens 775 to waist 9w located at or near the interior face 17i of end reflective element 17. Pump beam 9 and focusing lens 775 are aligned and oriented to locate pump beam waist 9w at or near laser resonator mode waist 76w; the pump beam waists approximately coincide (or match).

In the region of laser resonator cavity 75 where laser resonator mode 76 is collimated, that is, between concave fold reflective element 77 and output coupler reflective element 79, a wavelength tuning means 70 is disposed. Wavelength tuning means 70 can be any one of a number of commercially available means, such as a wavelength dispersive prism, a birefringent filter plate or birefringent filter plates, a diffractive device such as a diffraction grating, or other appropriate tuning means. Adjustments to laser tuning means 70 adjusts the output wavelength produced in laser output beam 72 in accordance with currently established techniques.

Figure 13:
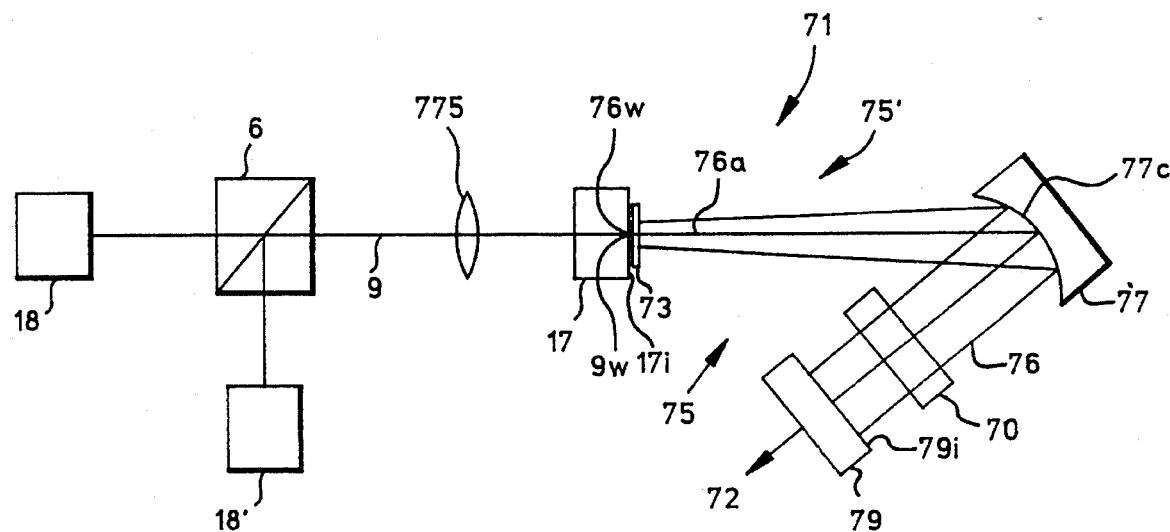
FIG. 13 illustrates a seventh embodiment of the invention.

Laser gain element 73 is illustrated in FIG. 13 as parallel to interior face 17i of end reflective element 17. In this orientation, the plane of laser gain element 73 is orthogonal to laser resonator mode axis 76a. Other orientations of the gain element are possible and in some cases desirable. For example, laser gain element 73 may be oriented at Brewster's angle with respect to laser resonator mode axis 76a and thereby provide a plane polarized output in output beam 72. Laser gain element 73 can be a laser dye-jet or a dye-containing material including any of the solid state laser dye gain elements noted above.

Figure 14A:
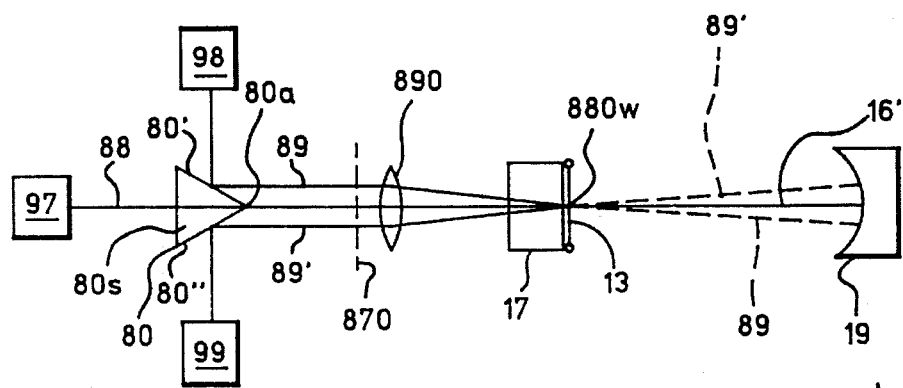
FIG. 14A illustrates an eight embodiment of the invention.

Scaling the dye laser to higher output power is straightforward. The gain medium is essentially two-dimensional, particularly when the gain element is in the form of an approximately 100 μm thick dye-jet. Therefore, angular multiplexing of multiple pump diodes is an efficient means of pump power scaling. An eighth embodiment of this inventive concept illustrating angular multiplexing of multiple laser diode plump sources is illustrated in FIG. 14A. Unlike longitudinally pumped solid state lasers, it is not necessary to match the pump and resonator modes over a significant path length in the gain element. Pump light incident on the dye gain element at any angle will excite the dye only within the active volume defined by the laser resonator mode, and therefore each pump diode will contribute equally to the total emitted laser output power. When using angular multiplexing, double pass absorption of the pump light will occur for angles contained within the solid angle determined by the resonator optical configuration. The optics required for an angularly multiplexed pump geometry can be relatively simple if the collimated output from each diode is reflected by one face of a multifaceted prism. See, for example, R. Scheps, U.S. Pat. No. 5,119,394, Jun. 2, 1992. Upon reflection, all pump beams are parallel and can be focused on the dye-jet using a single lens.

Referring to FIG. 14A, the laser resonator design of FIG. 1 is illustrated with an angularly multiplexed pumped geometry. It is to be noted, however, that any of the resonators which incorporate the teachings of this inventive concept may be pumped by the angularly multiplexed geometry illustrated in FIG. 14A. The laser design shown in FIG. 14A is used as an illustrative example. Tunable laser 11' contains end reflective element. 17, gain element 13 and output coupler reflective element 19. For ease of understanding of the inventive concept illustrated in FIG. 14A, laser gain element 13 will be described in terms of a dye-jet. However, other embodiments of the laser gain element including liquid and solid state embodiments, as described previously, are also appropriate for this technique of power scaling through angularly multiplexing laser diodes, as illustrated in FIG. 14A.

Three laser diodes 97, 98 and 99 are shown in the exemplary case illustrated in FIG. 14A. The projection illustrated in FIG. 14A is that of a side view, in which the dye-jet flows perpendicular to the plane of the page. Prism 80 has two faces, 80' and 80", which are coated to be highly reflective for the emission wavelengths produced by laser diodes 98 and 99, respectively, for the appropriate angle of incidence. The emission of laser diodes 98 and 99 are collimated, and upon reflection from faces 80' and 80", respectively, form pump beams 89 and 89', respectively. Pump beams 89 and 89' propagate parallel to one another as they approach focusing lens 890.

Figure 14B:
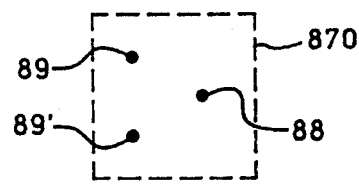
FIG. 14B illustrates the orientation of the pump beams produced by the pump optics in FIG. 14A.

Laser diode 97 produces collimated output 88. Laser diode 97 is oriented so that laser diode output beam 88 passes along side 80s of prism 80, passing without deflection. In this exemplary case pump beam 88 is coincident with laser resonator mode axis 16'. Viewed in cross-section at imaginary plane 870, the three pump beams define on the apexes of a triangle. This is illustrated in FIG. 14B.

As is well known from geometrical optics, parallel beams of light focus at the same point. Therefore, beams 89, 89' and 88 will all focus to a single pump beam waist 880w. This pump beam waist is located at or near laser gain element 13. Upon passing through laser gain element 13, laser diode pump beams 88, 89 and 89' diverge as illustrated in phantom in FIG. 14A. However, most of pump power has been absorbed in the single pass through the dye. Nonetheless, these pump beams are reflected by output coupler reflective element 19, back to laser gain element 13 for a second pass.

A unique feature of angularly multiplexed laser diode pumping of a thin dye laser gain element is that the divergence of the pumping beam, as illustrated in phantom in FIG. 14A, does not affect the pump efficiency as it occurs after the beam has passed through the gain element. The three pump beams illustrated in this exemplary case in FIG. 14A are coincident in the active volume contained in laser gain element 13. The active volume is the volume of the gain element that is optically excited by the pump beam and is contained within the laser resonator mode. The active volume produces optical gain for the laser output wavelength. Because laser gain element 13 is approximately 100 μm thick in this exemplary case, divergence does not cause the pump energy to be deposited outside of the active volume.

The exemplary case illustrated in FIG. 14A shows three laser diodes angularly multiplexed. Four diodes can be angularly multiplexed in an analogous manner by using an optical pyramid in place of prism 80, while five laser diodes can be angularly multiplexed, for example, by using the pump geometry illustrated in FIG. 14A but including a second prism similar to prism 80. The second prism is offset from prism 80 as described more fully in U.S. Pat. No 5,119,394 by R. Scheps cited above. In the case of five pump beams, the pattern of pump beams in imaginary plane 870 would form an "X" constellation.

An important feature of angular multiplexing laser diodes is that the pump beams are close to the axial ray and therefore optical distortions and aberrations are reduced or eliminated. The spacing between adjacent parallel beams is determined by the location of the intersection point of each collimated laser diode pump beam on the face of the multifaceted prism. For the embodiment shown in FIG. 14A, the separation between laser diode pump beam 89 and laser diode pump beam 89' in imaginary plane 870 can be minimized by reflecting collimated laser diode beams from laser diode 98 and 99 as close as possible to apex 80a of prism 80. The limitation in this technique is that as the point of reflection moves up to apex 80a, diffractive effects begin to reduce the power in the reflected laser diode pump beams.

As an example of the design criteria for angular multiplexing, consider five 1-Watt pump beams, each originating from two polarization combined, collimated 500 mW laser diodes. Using two prisms of the type illustrated in FIG. 14A, a pump array of five parallel beams arranged in an X constellation is produced. The central beam coincides with the laser resonator mode axis. The separation between adjacent beams can be 1 to 2 mm at the focusing lens. With this type of pump beam configuration, Fresnel losses at the HR flat and dye-jet for the extreme rays are not substantially different than for the paraxial rate. Additional losses for the extreme rays due to the angular dependence of the transmission of the dichroic coating will also be small. As the five pump beams can be easily contained within a circle of approximately 6 mm diameter at the focusing lens, the optical flux transport efficiency for the extreme rays will be comparable to that for the paraxial ray. On the other hand, the pump beam waist is sensitive to misalignment of each of the five beams.

The advantages of the diode pumped dye laser include low overall cost, high efficiency, small weight and volume and the ability to operate the dye laser with batteries. An additional advantage is a result of the unique combination of dye laser and laser diode properties. Unlike many optical excitation sources, laser diodes can operate pulsed or cw. The mode of diode operation depends only on the nature of the electrical drive current. The same diode can operate pulsed or cw depending on whether the injection current is supplied pulsed or cw. As an additional benefit, laser diodes can be modulated by modulating the drive current. Therefore the amplitude of the diode pump beam can be modulated by providing a modulation of the electrical drive current.

Referring back to FIG. 1 for example, laser diode 18 can produce a cw pumping beam if the electrical current used to drive laser diode 18 is a cw current. Alternatively, laser diode 18 will produce a pulsed or amplitude modulated pumping beam if the electrical current used to drive diode 18 is pulsed or amplitude modulated, respectively. Laser diodes require DC current, so modulated drive currents are generally DC currents with a component of amplitude-modulated current superimposed on the DC level. In no event should the polarity of the drive current be reversed.

Laser diodes can be modulated at rates exceeding 1 GHz. Most laser materials, and particularly almost all laser gain media that have been pumped by laser diodes, have radiative lifetimes in excess of several µs. For example, the fluorescence lifetime of Nd:YAG is approximately 200 µs, while the lifetime of Cr:LiSAF is 67 µs. Cr:LiSAF, which is $Cr^{3+}$-doped $LiSrAlF_6$, has the shortest lifetime of solid state materials directly pumped by AlGaAs or AlGAINP laser diodes. The lifetime of the laser gain element places an upper limit on the modulation rate that can be achieved when modulating the optical excitation source. For example, the maximum modulation rate for Nd:YAG is approximately 5 kHz. Under diode pumping, if the diodes are modulated at rate significantly faster than 5 kHz the Nd:YAG laser output will appear cw.

Fluorescence lifetimes of most dyes, on the other hand, are several ns. Therefore, modulation of the laser diode pump source at frequencies as fast as 1 GHz will produce a modulated diode output. Although the modulated diodes themselves might be appropriate for certain applications requiring high modulation rates (for example fiber optics communications) there are several advantages to using a diode pumped dye laser as the modulated transmitter. For one, single mode diode power is limited to several hundred mW. If a higher power single mode transmitter is desired, the diode-pumped dye laser described in this inventive concept enables the combination of several high power pump diodes to produce a single mode dye laser output. In addition, diodes are not tunable over more than a few nm while dye lasers emit over approximately 100 nm. For applications requiring secure communications, where frequency agility is desired, the dye laser is a superior choice compared to laser diodes.

An additional advantage of diode-pumped dye lasers arises from the fact that for excitation pulse lengths greater than several times the fluorescence lifetime, the dye laser produces a steady state emission for most of the duration of the excitation pulse. As discussed above, some applications are sensitive to optical damage. Such an application might be one where the laser propagates along a thin optical fiber. Since the optical damage threshold is power dependent, delivering a fixed amount of energy per pulse over a longer pulse width avoids the potential of optical damage. In comparison, OPO's and other techniques that use non-linear optical methods to convert IR radiation to near-IR or visible radiation, require short (~10 ns) pulses. The diode-pumped dye laser output pulse width is continuously tunable from several ns to cw. In addition, techniques have been described and are well-known for producing ps and fs ($10^{-15}$ s) pulses using dye lasers, so that an extraordinarily broad pulse width range can be generated by diode-pumped dye lasers.

A laser in accordance with this inventive concept has a wide range of applications, including various medical sensing, pollution monitoring, laser ranging, aircraft wind speed and wind shear measurement applications, surveillance and communications applications.

It should therefore be readily understood that many modifications and variations of the present invention are possible within the purview of the claimed invention. It is therefore to be understood that within the scope of the appended claims the invention may be practiced otherwise than as specifically described.

I claim:

1. A dye laser comprising:
   a resonator including an end reflective element and an output coupler reflective element for forming a laser resonator mode of laser energy having a laser resonator mode waist; a dye gain element operably coupled to said resonator for generating said laser energy;
   a laser diode operably coupled to said resonator for generating a pump beam having a wavelength between 610 nm and 690 nm; and
   a focusing element operably coupled to said laser diode for focusing said pump beam to form a pump beam waist substantially mode matched within said dye gain element to said laser resonator mode waist.

2. The dye laser of claim 1 wherein said dye gain element comprises a dye dissolved in a solvent.

3. The dye laser of claim 2 wherein said dye flows in a direction substantially perpendicular to an axis of said laser resonator mode.

4. The dye laser of claim 2 wherein said dye gain element comprises an optical cell through which said dye circulates.

5. The dye laser of claim 1 wherein said dye gain element comprises a dye distributed in a solid state host.

6. The dye laser of claim 5 wherein said solid state host comprises a plastic.

7. The dye laser of claim 5 wherein said solid state host comprises PMMA.

8. The dye laser of claim 5 wherein said solid state host comprises a polymer.

9. The dye laser of claim 5 wherein said solid state host comprises a glass.

10. The dye laser of claim 5 wherein said solid state host comprises a gel.

11. The dye laser of claim 5 wherein said dye gain element is configured to form a monolithic laser resonator.

12. The dye laser of claim 11 wherein one face of said dye gain element is substantially flat and another face of said dye gain element is substantially convex.

13. The dye laser of claim 11 wherein said dye gain element has two substantially flat faces.

14. The dye laser of claim 1 wherein said dye gain element comprises a thin film containing a dye.

15. The dye laser of claim 1 wherein said laser diode is a semiconductor laser diode comprising AlGaInP.

16. The dye laser of claim 1 further including means operably coupled to said resonator for establishing an output wavelength of said dye laser.

17. The dye laser of claim 1 wherein said end reflective element is a plane highly reflective element and said output coupler reflective element is a concave mirror output coupler.

18. The dye laser of claim 17 wherein unabsorbed pump power reflected by said output coupler is substantially mode matched to said laser resonator mode waist.

19. The dye laser of claim 17 wherein said end reflective element has an interior face coated for high reflectivity of said laser energy and for high transmission of said pump beam, and said concave mirror output coupler is coated for high reflectivity of said pump beam and for partial reflectivity of said laser energy.

20. The dye laser of claim 1 wherein said end reflective element and said output coupler reflective element are arranged to effect a nearly concentric laser resonator mode.

21. The dye laser of claim 20 in which said end reflective element has an interior face coated for high reflectivity of said laser energy and for high transmission of said pump beam, and said output coupler reflective element is coated for high reflectivity of said pump beam and for partial reflectivity of said laser energy.

22. The dye laser of claim 1 wherein said dye gain element has a pump direction at an angle with respect to a laser resonator mode axis.

23. The dye laser of claim 1 wherein said focuser includes a short focal length focusing lens for forming said pump beam waist.

24. The dye laser of claim 23 wherein said end reflective element comprises a reflectively coated plane face of said focusing lens.

25. The dye laser of claim 1 wherein said dye gain element has a thickness of about 100 μm.

26. The dye laser of claim 25 wherein said dye gain element comprises a dye-jet and said laser resonator mode axis is substantially orthogonal to each of at least two air-dye jet interfaces.

27. The dye laser of claim 1 wherein said dye gain element is oriented with respect to a laser resonator mode axis at Brewster's angle.

28. The dye laser of claim 1 wherein said end reflective element is a plane end reflective element and said output coupler reflective element is a concave output coupler reflective element, and said resonator further includes a concave fold mirror element.

29. The dye laser of claim 28 wherein said laser resonator mode is collimated in a region encompassing said laser resonator.

30. The dye laser of claim 29 further including means disposed in said region for varying a wavelength of said laser energy.

31. The dye laser of claim 1 further including:
   two laser diodes emitting polarized light having a wavelength between 610 nm and 690 nm;
   a collimator operably coupled to said laser diodes for collimating said polarized light; and
   a beam combiner operably coupled to said collimator to produce a single, combined pump beam.

32. The dye laser of claim 1 further including:
   a plurality of said laser diodes;
   a collimator operably coupled to said plurality of laser diodes;
   a beam combiner operably coupled to said collimator; and
   a beam focuser operably coupled to said beam combiner for forming a single pump beam waist.

33. The dye laser of claim 32 wherein said beam combiner directs said light from said plurality of laser diodes to said beam focuser.

34. The dye laser of claim 1 wherein said pump beam is cw.

35. The dye laser of claim 1 wherein said pump beam is pulsed and has a pulse width between 1 nanosecond and 1 second.

36. The dye laser of claim 1 wherein said pump beam is amplitude modulated.

37. The dye laser of claim 36 wherein said pump beam has a modulation frequency of at least 1 MHz.

38. The dye laser of claim 1 in which said end reflective element has an interior face coated for high reflectivity of said laser energy and for high transmission of said pump beam, and said output coupler reflective element is coated for high reflectivity of said pump beam and for partial reflectivity of said laser energy.

39. The dye laser of claim 38 wherein said end reflective element has an exterior face provided with an anti-reflective coating of said pump beam.

40. A method of pumping a dye laser comprising the steps of:
   generating a pump beam having a wavelength between 610 nm and 690 nm;
   end-pumping a dye gain element with the pump beam; and
   reflecting optical emission from the dye gain element to establish a nearly hemispherical laser resonator mode.

41. The method of claim 40 wherein the dye gain element comprises a dye dissolved in a solvent.

42. The method of claim 41 wherein the dye gain element comprises a jet of dye solution.

43. The method of claim 40 wherein the dye gain element comprises a solid state material.

44. The method of claim 43 wherein the solid state material comprises a polymer.

45. The method of claim 40 wherein the pump beam is generated by a laser diode comprising AlGaInP.

46. The method of claim 40 wherein the pump beam is generated by a plurality of laser diodes.

47. The method of claim 46 wherein the pump beam is polarized and combined.

48. The method of claim 46 wherein the pump beam is angularly multiplexed.

49. The method of claim 40 wherein the pump beam is cw.

50. The method of claim 40 wherein the pump beam is amplitude modulated.

51. The method of claim 50 wherein the pump beam is modulated by a frequency of at least 1 MHz.

52. The method of claim 40 wherein the pump beam is reflected in an optical resonator and passed through an active volume of the dye gain element at least two times.

53. A dye laser comprising:

a resonator having a plane highly reflective end element and a concave mirror output coupler reflective element operably coupled to establish a nearly hemispherical laser resonator mode of laser energy having a laser resonator mode waist;

a dye gain element operably coupled to said resonator to produce optical radiation when optically excited by a pump beam having at least one wavelength between 610 nm and 690 nm; and a pump beam source operably coupled to said dye gain element for optically exciting said dye gain element in an end pumping mode wherein said pump beam source includes at least one laser diode emitting said pump beam and a focusing lens operably coupled to said laser diode to provide a pump mode waist substantially mode matched within said dye gain element to said laser resonator mode waist.

54. The dye laser of claim 53 wherein said dye gain element further comprises a dye dissolved in a solvent.

55. The dye laser of claim 54 wherein said dye gain element further comprises a jet of said dye flowing in a direction substantially perpendicular to a longitudinal axis of said laser resonator mode.

56. The dye laser of claim 54 wherein said dye gain element further comprises an optical cell through which said dye circulates.

57. The dye laser of claim 53 wherein said dye gain element further comprises a dye distributed in a solid state host.

58. The dye laser of claim 57 wherein said solid state host comprises a plastic.

59. The dye laser of claim 57 wherein said dye containing gain element has a thickness of about 100 μm.

60. The dye laser of claim 53 further including means for varying an output wavelength of said dye laser.

61. The dye laser of claim 53 wherein an interior face of said reflective end element is coated for high reflectivity of said laser energy and for high transmission of said pump beam and said concave mirror output coupler is coated for high reflectivity of said pump beam and for partial reflectivity of said laser energy.

62. The dye laser of claim 53 wherein said reflective end element has an exterior face provided with a coating that is anti-reflective of laser energy between 610 nm and 690 nm.

63. A dye laser comprising:

a resonator including an end reflective element and an output coupler reflective element operably coupled to establish a nearly hemispherical laser resonator mode of laser energy having a laser resonator mode waist;

a dye gain element operably coupled to said resonator for generating said laser energy;

a laser diode operably coupled to said resonator for generating a pump beam having a wavelength between 610 nm and 690 nm;

means for varying an output wavelength of said dye laser;

a focusing element operably coupled to said laser diode for focusing said pump beam to form a pump beam waist substantially mode matched within said dye gain element to said laser resonator mode waist to thereby improve laser power conversion efficiency.

* * * * *